United States Patent
O'Daniel et al.

(10) Patent No.: US 12,163,634 B2
(45) Date of Patent: Dec. 10, 2024

(54) SHARED OPTIC ASSEMBLY FOR COMBINED DOT AND FLOOD ILLUMINATION MODULES

(71) Applicant: II-VI Delaware, Inc, Wilmington, DE (US)

(72) Inventors: Jason O'Daniel, Gunter, TX (US); Pei-Song Cai, Wilmington (TW); Francesco Shiattone, San Jose, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 554 days.

(21) Appl. No.: 17/450,368

(22) Filed: Oct. 8, 2021

(65) Prior Publication Data

US 2023/0116691 A1    Apr. 13, 2023

(51) Int. Cl.
| | |
|---|---|
| *F21K 9/69* | (2016.01) |
| *F21Y 105/16* | (2016.01) |
| *F21Y 113/13* | (2016.01) |
| *F21Y 115/30* | (2016.01) |
| *G02B 3/00* | (2006.01) |
| *H01L 27/15* | (2006.01) |
| *H01S 5/00* | (2006.01) |
| *H01S 5/183* | (2006.01) |

(52) U.S. Cl.
CPC .............. *F21K 9/69* (2016.08); *G02B 3/0037* (2013.01); *H01L 27/15* (2013.01); *H01S 5/005* (2013.01); *H01S 5/183* (2013.01); *F21Y 2105/16* (2016.08); *F21Y 2113/13* (2016.08); *F21Y 2115/30* (2016.08)

(58) Field of Classification Search
None
See application file for complete search history.

(56) References Cited

U.S. PATENT DOCUMENTS

| | | | | |
|---|---|---|---|---|
| 2012/0177074 A1* | 7/2012 | Liu | ........................ | H01S 5/0235 165/185 |
| 2021/0286191 A1* | 9/2021 | Downing | .............. | G01S 7/4815 |
| 2022/0342070 A1* | 10/2022 | Kobayashi | ......... | G02B 27/0922 |

FOREIGN PATENT DOCUMENTS

| | | | | |
|---|---|---|---|---|
| CN | 108169981 A | * | 6/2018 | ........... G02B 27/425 |
| KR | 20210115765 A | * | 9/2021 | |
| WO | 2021198269 A1 | | 10/2021 | |

* cited by examiner

*Primary Examiner* — Andrew Smyth
(74) *Attorney, Agent, or Firm* — Blank Rome LLP

(57) ABSTRACT

A shared optic assembly for combined flood and dot illumination modules is disclosed. The shared optic assembly includes a first high-powered VCSEL element for providing a flood beam and a second high-powered VCSEL element for providing a dot beam, where both the first and second VCSEL elements share the same optics and are incorporated onto the same module for space savings.

16 Claims, 8 Drawing Sheets

SHARED OPTIC ASSEMBLY FOR COMBINED DOT AND FLOOD ILLUMINATION MODULES

BACKGROUND OF THE DISCLOSURE

Flood illuminators are incorporated into various products such as, for example, mobile devices and other applications, to provide 3D sensing capabilities, 3D mapping in robotics, face detection, etc. For example, with reference to FIG. 1, an optic assembly 100 incorporated within, e.g., a mobile device, including a flood illuminator uses a vertical-cavity surface-emitting laser (VCSEL) 102 for providing a flood beam 104 to optics 106 which, in turn, produces a uniform field of illumination of infrared (IR) light from output 108 onto an object or person of interest (not shown). FIG. 2 shows an example of a flood beam generated using a known optic assembly, such as depicted in FIG. 1.

A dot projector is also sometimes used in combination with a flood illuminator. The dot projector uses a second VCSEL 103 for producing a dot beam 105 to optics 107 which, in turn, produces a multitude of dots of IR light from output 108 to create a three-dimensional map of the illuminated object of interest for area and depth determinations. An infrared camera (not shown) captures images of the depth signature from the modulated IR flood light, and if employed, also from the dot pattern reflected back from the illuminated object of interest. Processing of the captured data can then be used for desired purposes such as, for example, facial recognition. One drawback associated with conventional flood illuminators is their range is limited to about 1.5 m. This relatively short range greatly limits the types of applications in which this technology may be used.

The subject matter of the present disclosure is directed to overcoming, or at least reducing the effects of, one or more of the problems set forth above.

SUMMARY OF THE DISCLOSURE

A shared optic assembly for combined flood and dot illumination modules is disclosed. The shared optic assembly includes a first high-powered VCSEL element for providing a flood beam and a second high-powered VCSEL element for providing a dot beam, where both the first and second VCSEL elements share the same optics. The dot beam is generated using the same level of optical power as the flood beam, but the dot beam is condensed into dots. As a result, the return signal is high enough to detect at longer range than achieved with the flood beam alone. A tradeoff is the received information is lower resolution since only the information where the dots are located is reflected back to the infrared camera. The overall system uses the same infrared camera for both dot and flood functions, but yields a short range detection with high resolution using the flood beam and longer range detection with lower resolution using the dot beam. Through the use of the invention, the effective range increases from about 1.5 m to about 6 m. Further, because the flood and dot modules share the same optics, significant cost and space savings are realized.

The foregoing summary is not intended to summarize each potential embodiment or every aspect of the present disclosure.

DETAILED DESCRIPTION OF THE DISCLOSURE

Figure 1:
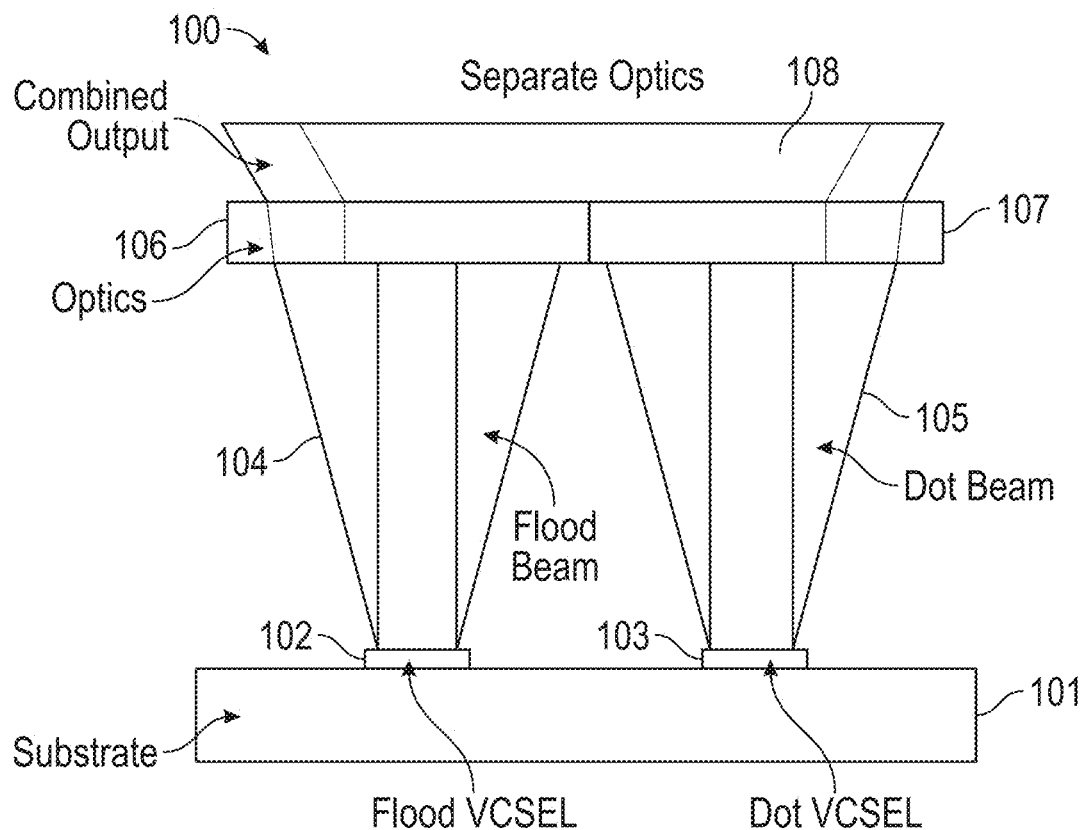
FIG. 1 illustrates an optic assembly with separate dot and flood illumination modules, as known in the art.
Figure 2:
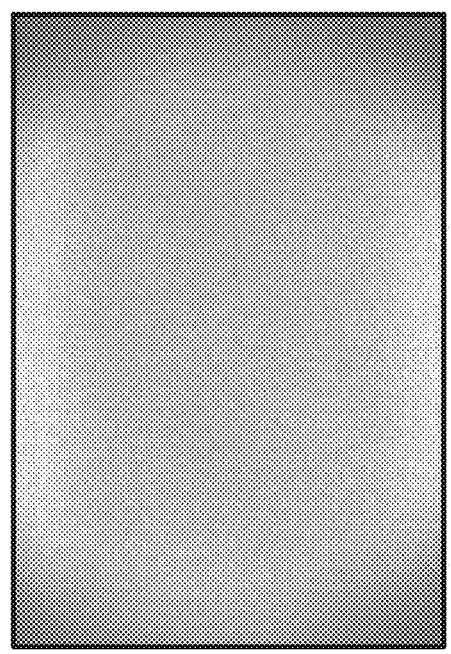
FIG. 2 illustrates a flood beam generated using a standard randomized diffuser, as known in the art.
Figure 3:
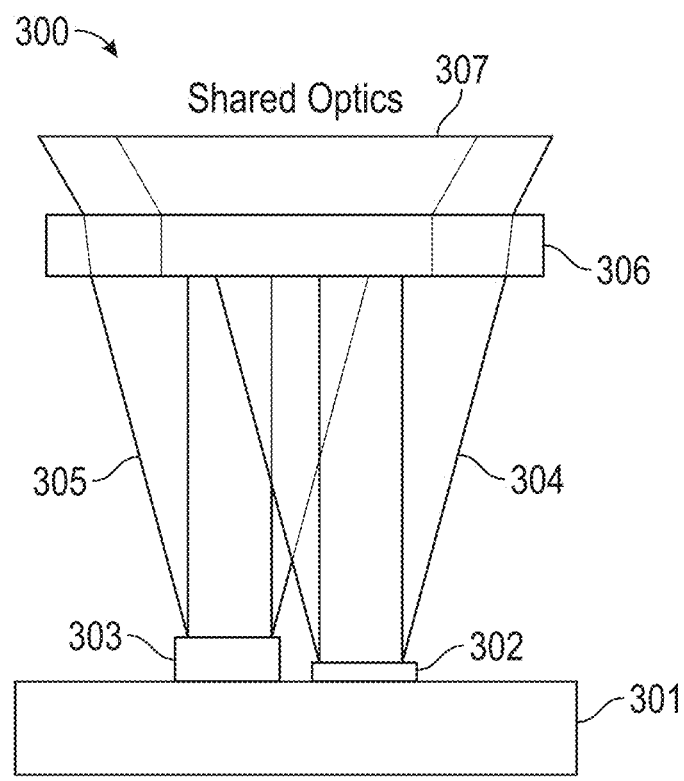
FIG. 3 illustrates a shared optic assembly with combined dot and flood illumination modules and shared optics, in accordance with an exemplary embodiment of the invention.

Referring to FIG. 3, a high-powered VCSEL illuminator assembly 300 includes combined dot and flood illumination modules. The combined modules include a first VCSEL element 303 configured to provide a flood beam 305 and a second VCSEL element 302 configured to provide a dot beam 304. The two VCSEL elements 302, 303 are mounted on a substrate 301, and the assembly 300 includes a shared optic 306 disposed adjacent to the substrate 301. The assembly 300 is intended to be used as a component of an overall system, such as, for example, a facial recognition unit of a mobile device.

The dot beam VCSEL element 302 is mounted on the substrate 301 in a defined configuration and at a defined distance (referred to as the working distance ("WD")) relative to the shared optics 306. The flood beam VCSEL element 303 is also mounted on the substrate 301 in a defined configuration and at a defined distance relative to the shared optic 306, where the defined distance is offset from the working distance. The dot beam and the flood beam are imaged by the shared optic 306 to generate output 307.

As explained in greater detail below in connection with an exemplary embodiment, the shared optics 306 includes a periodic diffuser optical element to generate both a dot field and a flood illumination field by using the emissions of two separate VCSELs 303, 302 in relatively close proximity to each other. The combined beams result in short range detection with high resolution using the flood beam and longer range detection, with lower resolution, using the dot beam. Because the dot beams concentrate the VCSEL emissions into small spots with increased intensity, the overall range of the system is increased. There is some loss in resolution for higher ranges because only the dot beams are reflected back from the object to the detector. The effective range of the overall system is increased from about 1.5 m, using only the flood beam, to about 6 m, using the dot beams.

In one example of an application of the invention, the IR sensor could extract depth information from the flood beam, then switch and extract depth information from the dot beam, and combine the depth information of the two modes. The dot mode could be used, for example, when scanning a room for dimension for furniture visualization. The flood could be used, for example, for facial mapping or when mapping objects close up. Moreover, because the dot and flood VCSELs share common optics, both are incorporated onto the same module, resulting in appreciable size savings over modules where optics are not shared.

Still referring generally to FIG. 3, the dot field VCSEL 302 is configured to work at a pre-determined working distance from the shared optics 306 and has a pitch defined between emitters such that diffraction effects at the shared optics 306 create a dot field. The distance between the flood field VCSEL 303 and the shared optics 306 is offset from this working distance to avoid such diffraction effects. For example, a thicker VCSEL substrate 303 or added height from the mounting substrate 301, as compared with the dot field VCSEL 302 can be used to produce the required offset distance. The offset distance avoids having a high contrast diffraction effect, which while desirable for the dot imager, is undesirable for the flood imager.

Still referring generally to FIG. 3, diffraction effects from self-imaging the periodic diffuser array from a small source causes each individual emitter to be reimaged within an envelope of the diffuser's output profile. Emitters are appropriately pitched so that all of the single emitter array images are aligned over one another. The phenomenon is theoretically similar to the Lau effect, with an array of lasers being substituted in place of an illuminated first grating. See e.g., Sudol, R. (1981), Lau Effect: An Interference Phenomenon in Partially Coherent Light [Thesis], The University of Rochester, Rochester, N.Y. The theory provides that high contrast images can be achieved at a distance $Z=np^2/2\lambda$, where n is a positive integer, p is the diffuser array pitch, and $\lambda$ is the wavelength of light.

As this high contrast phenomenon occurs only at specific distances, an offset or defocus between the VCSEL laser array and the periodic diffuser array can diminish the contrast. If the second VCSEL emitter (i.e., the flood VCSEL 303) layout is designed such that the differences in X and Y between the lasers and the closest diffuser freeform lenslet optical center are distributed somewhat evenly across the extent of the area of a single diffuser freeform lenslet surface, the diffraction effects can be mostly washed out.

This can be done through a straightforward configuration. For example, a square diffuser array with a 35 um pitch can have high contrast at a distance of 2606 um for n=4 and $\lambda$=940 nm. A VCSEL working at 2400 um with a 20×20 emitter layout with a square pitch of 35*(1+1/20) can provide a highly uniform X and Y difference distribution. Uniform X and Y difference distributions can be achieved in a variety of ways including rectangular, square, or hexagonal arrays of VCSELs of various pitches with specific rotation angles or specifically designed pseudo-random VCSEL arrays. It should be noted that although a wavelength of 940 nm is used in this example for both the dot and flood VCSEL emitters since it is a commonly used wavelength for 3-D sensing applications, the invention is not limited to any particular emitter wavelength or any particular application. For example, VCSEL emitters having wavelengths of 850 nm, another commonly used VCSEL wavelength, may be employed. Longer or shorter wavelengths may also be used. Further, the wavelength of the dot and flood VCSEL emitters need not be the same. For example, the wavelength for the dot emitter may be 940 nm while the wavelength of the flood emitter may be 850 nm, or vice versa. Having two different wavelengths for the emitter requires a wider filter on the receiver side than if the same wavelength is emitted from both arrays. Alternatively, a filter with multiple passbands may also be used on the receiver side if the emitters have different wavelengths.

Figure 4A:
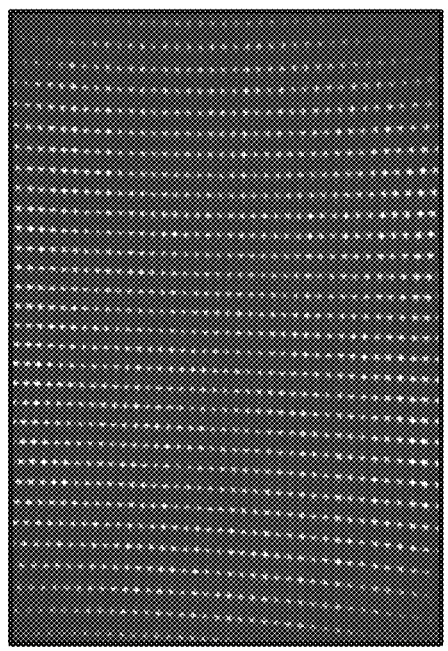
FIG. 4A illustrates a dot projector pattern generated in accordance with an exemplary embodiment of the invention.

FIG. 4A depicts an image of a projected pattern of a dot VCSEL 302 properly matched with, and at an appropriate working distance from, shared optics 306.

Figure 4B:
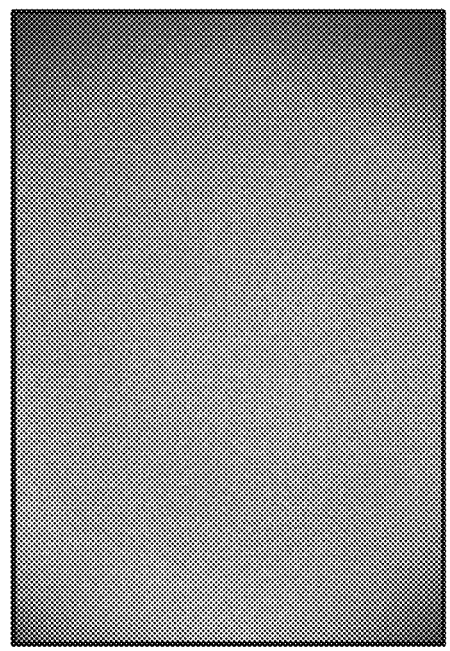
FIG. 4B illustrates a flood beam generated in accordance with an exemplary embodiment of the invention.

FIG. 4B depicts an image of a projected pattern of a flood VCSEL 303 mismatched with, and at a 150 um offset, or defocus, from shared optics 306.

Figure 5:
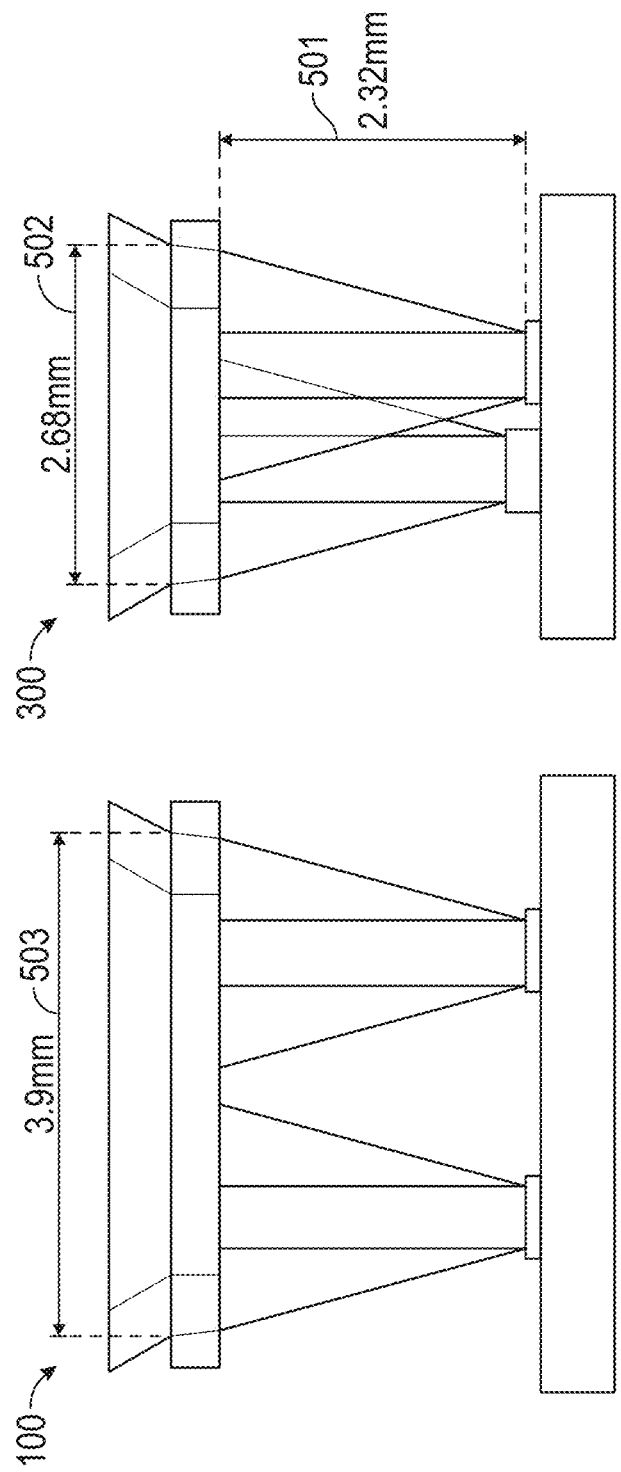
FIG. 5 shows expected space savings based on working distance, in accordance with exemplary embodiments of the invention.

Referring now to FIG. 5, several examples VCSEL illuminator assembly size reductions achievable with the invention are depicted. On the left side of FIG. 5 is a prior art VCSEL illuminator assembly 100 and on the right is VCSEL illuminator assembly 300 (as described in FIG. 3), in accordance with an exemplary embodiment of the invention. In the illustrated example, and with references to the table (middle row), for a working distance of 2.3 mm, the beam width for shared optics in assembly 300 is 2.7 mm, whereas the beam width for assembly 100 with separate optics is 3.9 mm. Thus, in this example, there is a size reduction of approximately 24% achieved as a result of the invention.

For a smaller working distance of 1.7 mm, the beam width for shared Optics in assembly 300 is 2.4 mm, whereas the beam width for assembly 100 with separate optics is 3.2 mm. In this example, there is a size reduction of approximately 19% achieved as a result of the invention. Lastly, for a larger working distance of 2.8 mm, the beam width for shared optics in assembly 300 is 3 mm, whereas the beam width for assembly 100 with separate optics is 4.6 mm. In this example, there is a size reduction of approximately 28% achieved as a result of the invention. Thus, the percentage of the size reductions increases as the working distance increases.

Figure 6:
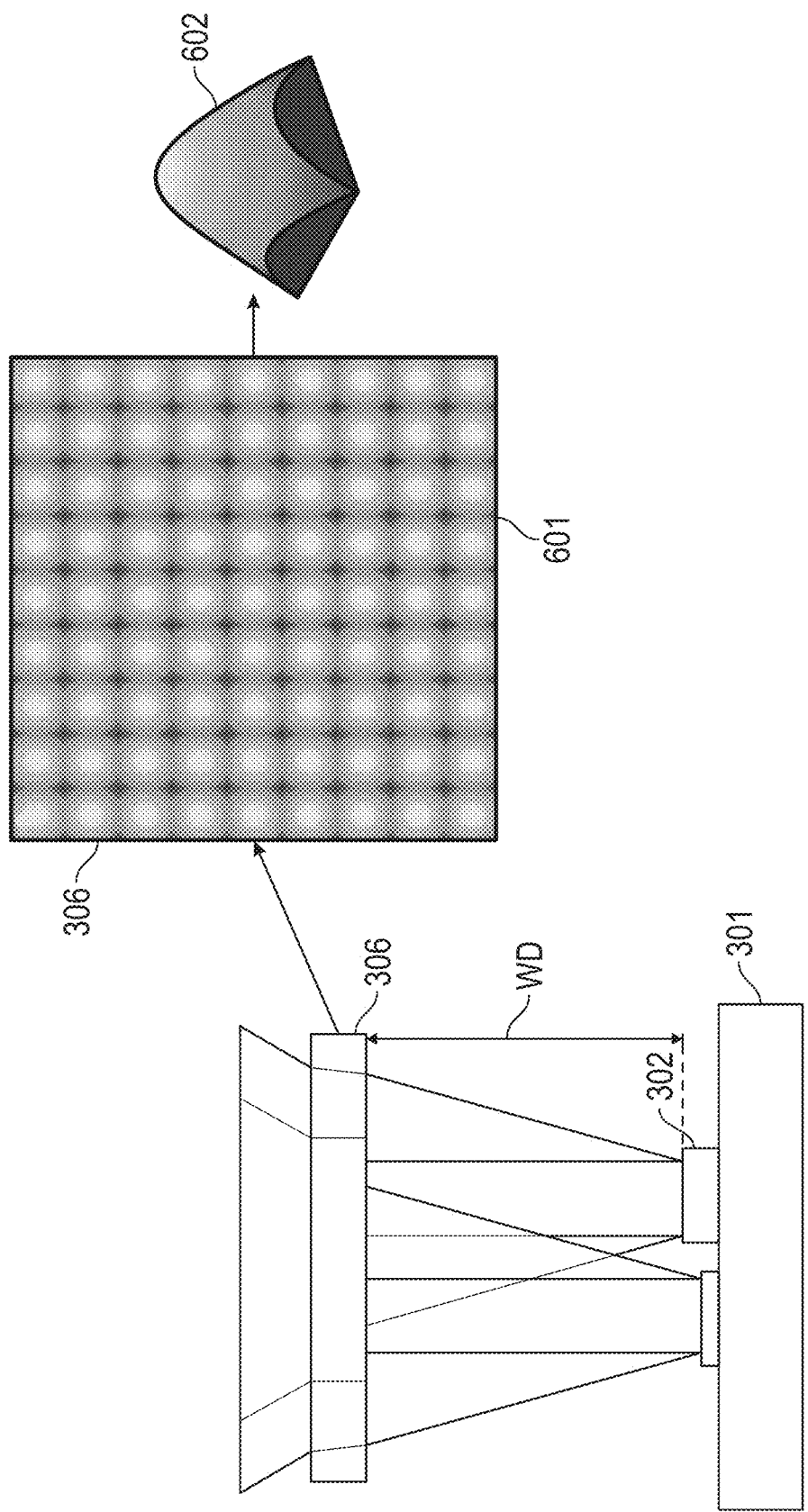
FIG. 6 illustrates a configuration of shared optics, in accordance with an exemplary embodiment of the invention.

Referring now to FIG. 6, the diffuser of shared optic 306 (in FIG. 3), includes a periodic array of identical, free-form surfaces that shape incident light into a desired illumination or diffused profile. In this exemplary embodiment, the periodic diffuser has a square layout 601 with an X and Y pitch of 33 microns. Each lenslet 602 is the same and is designed to spread the incoming light over a specified field of illumination. In this example, the working distance ("WD"), i.e., the distance between the dot field VCSEL 302 and shared optics 306, is 2.32 mm (i.e., $np^2/2\lambda=(4*33^2/(2*0.94)=2.32$ mm).

Figure 7:
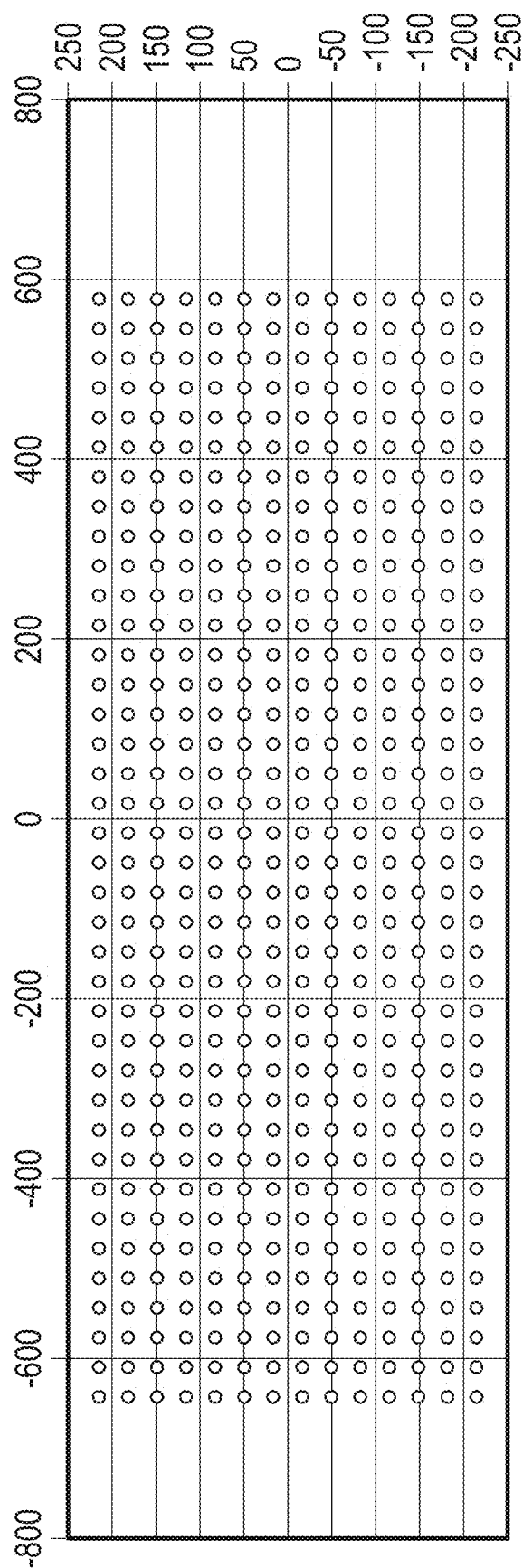
FIG. 7 illustrates a dot VCSEL layout, in accordance with an exemplary embodiment of the invention.

Referring now to FIG. 7, a dot VCSEL 302 (in FIG. 3) array is depicted, in accordance with an exemplary embodiment of the invention. The dot VCSEL 302 array is a square layout periodic array with an X and Y pitch of 33 microns (532 emitters/8 um oxide aperture). Notably, the dot VCSEL 302 array must be matched in some way to the diffuser optic.

The dot VCSEL 302 array pitch must be some integer multiple or integer fraction of the optic pitch (i.e. 3, 2, 1, ½, ⅓). It has been found that 1× works well. Alternatively, much larger optics pitches and integer fraction VCSEL pitches may be used, but this results in a larger number of dots in the dot field and reduced peak intensity for each dot. Larger optics pitches and integer fractions can also result in too long of a working distance. It should also be noted that smaller optics pitches may be used along with 2×VCSEL pitches, but this arrangement can result in fabrication issues on the optics.

Figure 8:
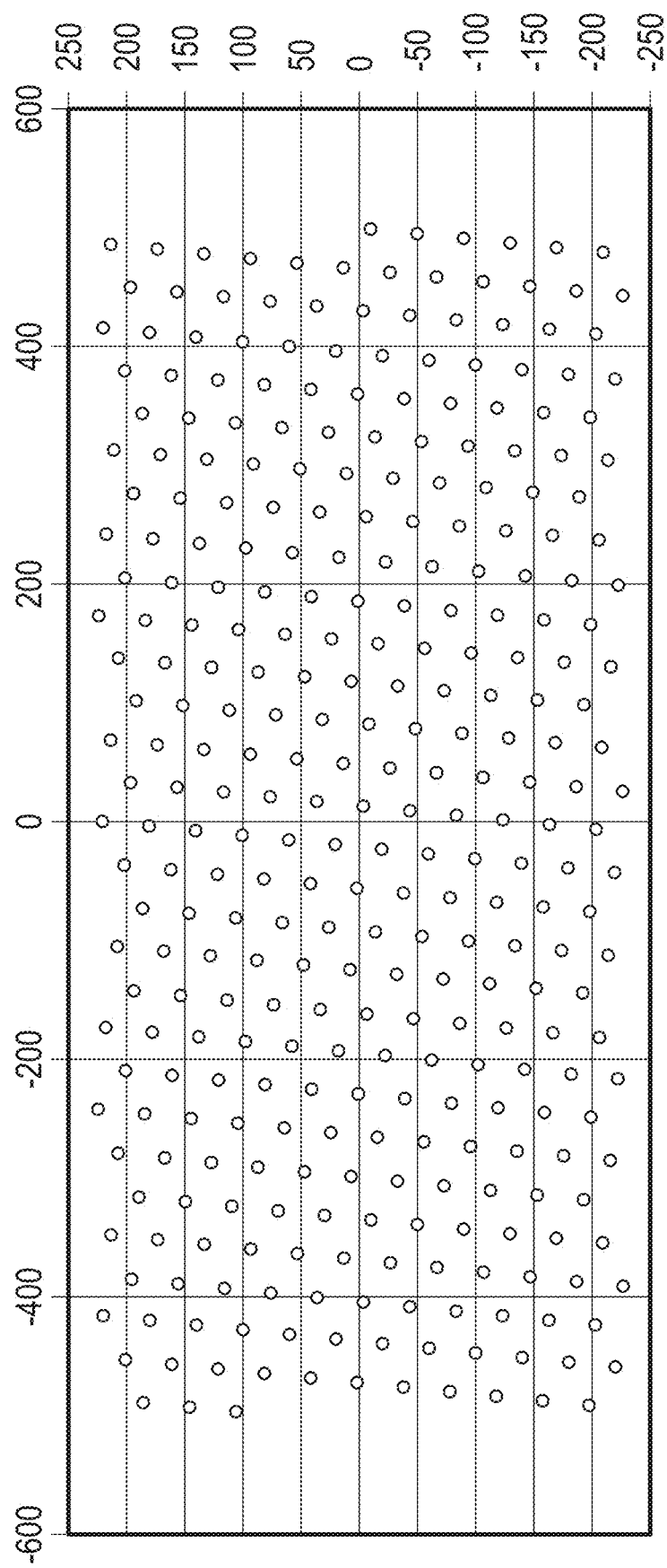
FIG. 8 illustrates a flood VCSEL layout, in accordance with an exemplary embodiment of the invention.

Turning to FIG. 8, a flood VCSEL 303 (in FIG. 3) array is depicted, in accordance with an exemplary embodiment of the invention. The flood VCSEL 303 array is a hexagonal layout periodic array with a pitch of 40 microns rotated at 24.5 degrees (327 emitters/10 um oxide aperture). Notably, for the flood VCSEL 303, any layout that results in a relatively well spread-out distribution in the difference VCSEL emitter versus the center of the closest lenslet 602 (in FIG. 6) will result in adequate performance. In this exemplary embodiment, the flood VCSEL 303 was mounted on a 300 um thick CuW spacer to provide the needed defocus. In this instance, a working distance of 1.738 mm (i.e., $3*33^2/(2*0.94)$) would be at another high contrast distance, so approximately half way between distances corresponding to n=3 and n=4, resulting in a distance of approximately 2 mm, was found to work well.

Figure 9:
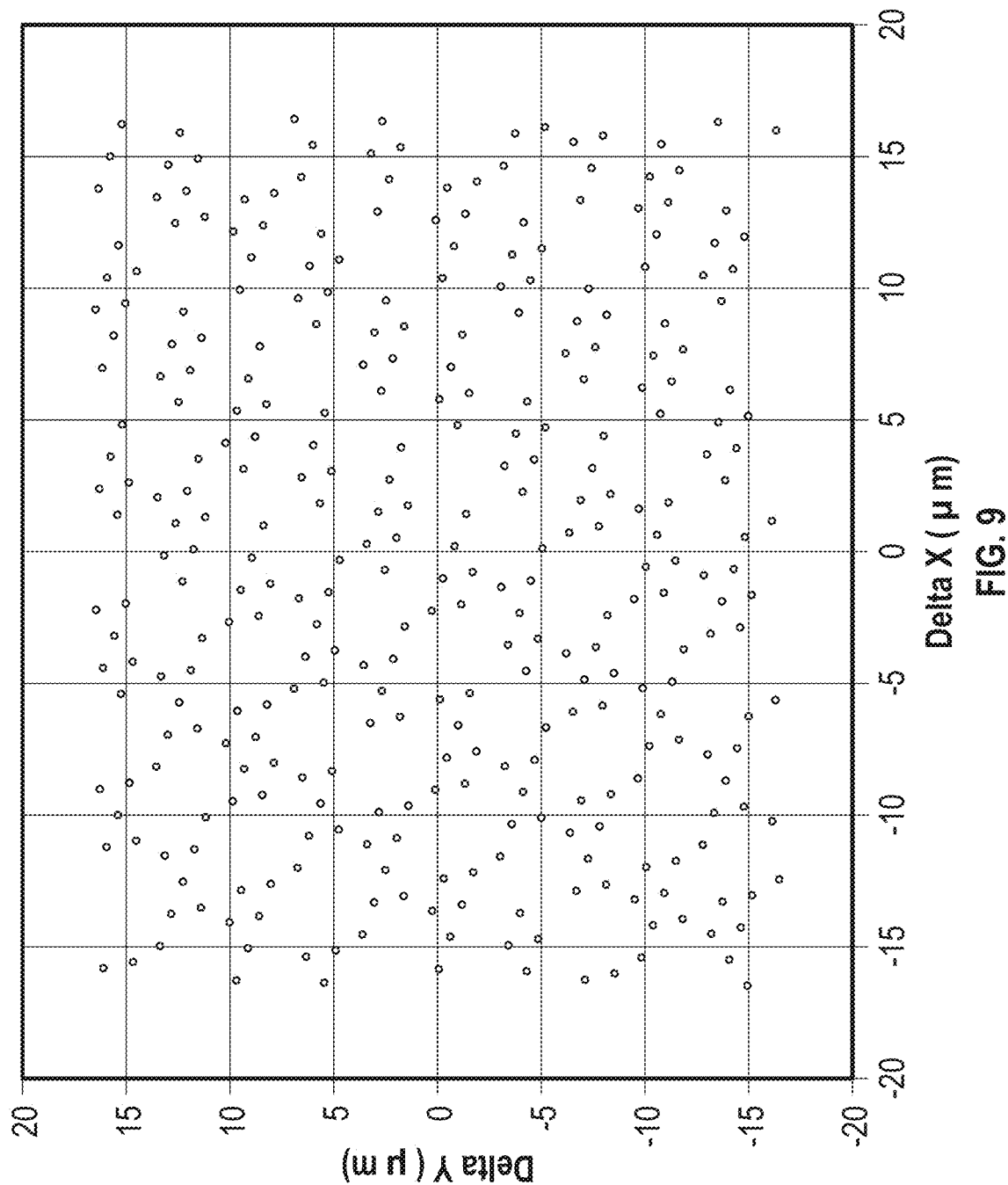
FIG. 9 illustrates a distribution of the X-axis and Y-axis difference between individual flood VCSEL emitters (of FIG. 8), and the closest diffuser lenslet center (of FIG. 6), in accordance with an exemplary embodiment of the invention.

Referring now to FIG. 9, a distribution of the X and Y difference between individual flood VCSEL 303 emitters and the closest diffuser lenslet 602 center is depicted, as explained in connection with FIG. 8. Each point in the scatter plot represents the X and Y delta between a single VCSEL emitter and the closest diffuser lenslet center. In the examples depicted in FIGS. 6 and 8, the range of the delta is +/−16.5 um in both dimensions, since the size of the lenslet 602 is 33 um. Essentially, the VCSEL emitters are scattered around so that they are as far from matching the periodicity of the diffuser lenslets. This arrangement helps wash out any remaining diffraction effects.

Figure 10:
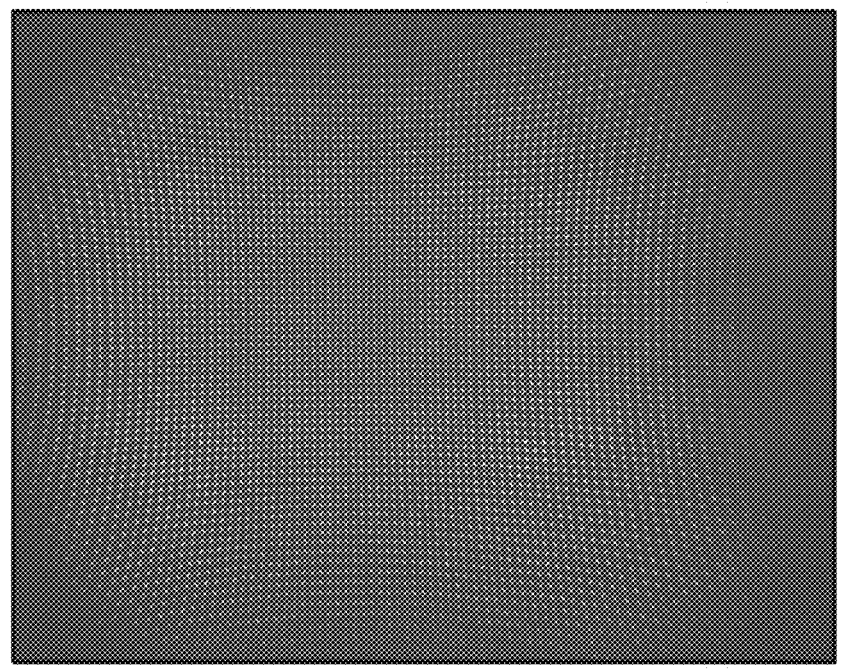
FIG. 10 illustrates a dot field generated using an exemplary embodiment of the invention.
Figure 11:
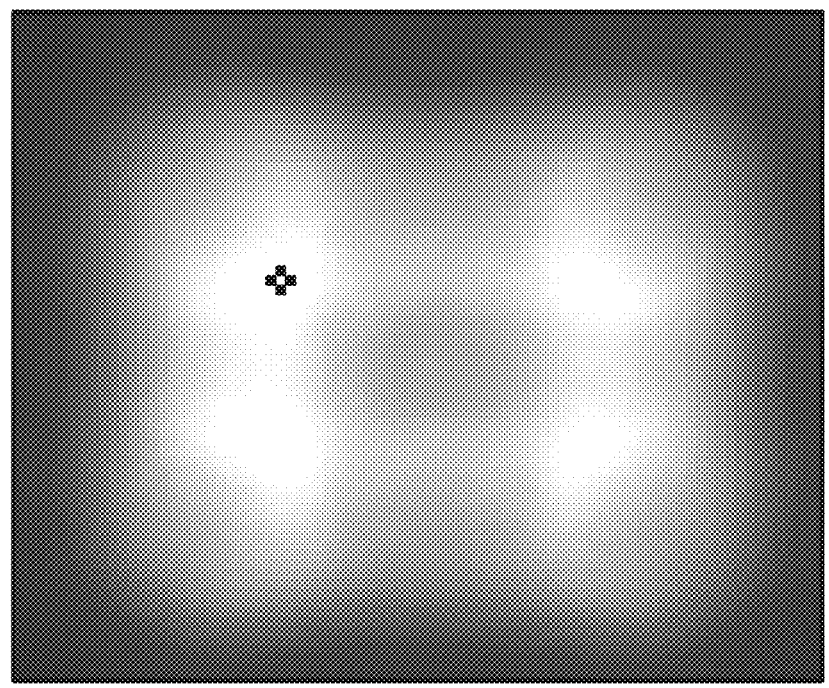
FIG. 11 illustrates a flood field generated using an exemplary embodiment of the invention.

Referring now to FIGS. 10 and 11, a dot field and flood field are respectively shown, as generated with the configuration described in connection with FIGS. 6-9. Using the principles and specific arrangements described herein, a range of approximately 1.5 m was achieved with the flood field in FIG. 11 and a range of approximately 6 m was achieved with the dot field of FIG. 10.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

In exchange for disclosing the inventive concepts contained herein, the Applicants desire all patent rights afforded by the appended claims. Therefore, it is intended that the appended claims include all modifications and alterations to the full extent that they come within the scope of the following claims or the equivalents thereof.

What is claimed is:

1. A vertical-cavity surface-emitting laser (VCSEL) illuminator assembly comprising:
   a first VCSEL array configured to generate a dot beam;
   a second VCSEL array adjacent to the first VCSEL array, the second VCSEL array being configured to generate a flood beam; and
   diffuser optics shared by the first VCSEL array and the second VCSEL array, wherein
   the diffuser optics are configured to receive the dot beam and the flood beam respectively emitted from the first VCSEL array and the second VCSEL array,
   the diffuser optics comprise an outer face that faces the first VCSEL array and the second VCSEL array, and
   the first VCSEL array and the second VCSEL array are each configured to respectively direct a portion of the dot beam and a portion of the flood beam at a common location on the outer face of the diffuser optics.

2. The VCSEL illuminator assembly of claim 1, wherein the first VCSEL array is located a first distance from the shared diffuser optics and the second VCSEL array is located a second distance from the shared diffuser optics that is different than the first distance.

3. The VCSEL illuminator assembly of claim 2, wherein the first distance is approximately 2.33 mm and the second distance is approximately 2 mm.

4. The VCSEL illuminator assembly of claim 3, wherein the second VCSEL array is mounted on a substrate that is at least 300 μm thicker than a substrate that the first VCSEL array is mounted on.

5. The VCSEL illuminator assembly of claim 4, wherein the substrate that the second VCSEL array is mounted on is a 300 μm thick CuW spacer.

6. The VCSEL illuminator assembly of claim 1, wherein a pitch of the first VCSEL array is an integer multiple of a pitch of the shared diffuser optics.

7. The VCSEL illuminator assembly of claim 6, wherein the pitch of the first VCSEL array is 1×, 2×, or 3× a pitch of the diffuser optics.

8. The VCSEL illuminator assembly of claim 1, wherein a pitch of the first VCSEL array is an integer fraction of a pitch of the diffuser optics.

9. The VCSEL illuminator assembly of claim 8, wherein the pitch of the first VCSEL array is ½× or ⅓× the pitch of the diffuser optics.

10. The VCSEL illuminator assembly of claim 1, wherein:
    the second VCSEL array comprises emitters,
    the diffuser optics comprises lenslets, and
    an X delta and a Y delta exists between each of the emitters of the second VCSEL array and a center of the closest respective lenslet of the diffuser optics.

11. The VCSEL illuminator assembly of claim 10, wherein a range of both the X delta and the Y delta is between −16.5 μm and 16.5 μm, inclusive.

12. The VCSEL illuminator assembly of claim 1, wherein:
    the first VCSEL array and the second VCSEL array are configured to respectively emit the dot beam and the flood beam at a common wavelength, and
    the common wavelength is 850 nm or 940 nm.

13. The VCSEL illuminator assembly of claim 1, wherein the first VCSEL array is configured to emit the dot beam at a wavelength that is different than a wavelength that the second VCSEL array is configured to emit the flood beam at.

14. The VCSEL illuminator assembly of claim 1, wherein:
    the first VCSEL array and the diffuser optics are configured such that a diffraction effect is created when the dot beam passes through the diffuser optics, and
    the second VCSEL array and the diffuser optics are configured such that no diffraction effect is created when the flood beam passes through the diffuser optics.

15. The VCSEL illuminator assembly of claim 1, wherein:
    the first VCSEL array and the second VCSEL array are spaced apart from the diffuser optics along a direction, and
    the first VCSEL array is configured to emit the dot beam at a location that is offset, along the direction, relative to a location at which the second VCSEL array is configured to emit the dot beam.

16. The VCSEL illuminator assembly of claim 1, wherein the diffuser optics comprise a plurality of lenslets that are each the same.

* * * * *